United States Patent [19]
Yamanaka

[11] Patent Number: 5,422,512
[45] Date of Patent: Jun. 6, 1995

[54] SEMICONDUCTOR DEVICE AND RETICLE USED FOR FABRICATING THE SAME
[75] Inventor: Koji Yamanaka, Tokyo, Japan
[73] Assignee: NEC Corporation, Tokyo, Japan
[21] Appl. No.: 904,953
[22] Filed: Jun. 26, 1992
[30] Foreign Application Priority Data
Jun. 26, 1991 [JP] Japan .................. 3-153658
[51] Int. Cl.6 .................. H01L 29/78; H01L 29/06
[52] U.S. Cl. .................. 257/506; 257/296; 257/288
[58] Field of Search .................. 437/63; 257/374, 333, 257/395, 296, 506, 288

[56] References Cited
U.S. PATENT DOCUMENTS 3,883,948  5/1975  Allison .................. 437/63
4,012,764  3/1977  Satonaka .................. 257/773
4,763,178  8/1988  Sakui .................. 257/296
5,021,359  6/1991  Young et al. .................. 437/63
5,094,973  3/1992  Pang .................. 257/374
5,101,261  3/1992  Maeda .................. 257/773

Primary Examiner—Jerome Jackson
Attorney, Agent, or Firm—Burns, Doane, Swecker & Mathis

[57] ABSTRACT

A semiconductor device is provided with a device formation region formed by etching with using a reticle as an etching mask. The device formation region is shaped to have at least two curved portions having different radiuses, being encircled with an insulation layer, so that radiated light is not converged to a point of an inside of the device formation region by light reflection on an inner edge of the insulation layer.

1 Claim, 5 Drawing Sheets

SEMICONDUCTOR DEVICE AND RETICLE USED FOR FABRICATING THE SAME

FIELD OF THE INVENTION

This invention relates to a semiconductor device, and more particularly to, a shape of a device formation region and a reticle used for fabricating the same.

BACKGROUND OF THE INVENTION

A conventional semiconductor device is positioned on a device formation region of a semiconductor substrate, and is separated by a device separation region thereof. There are two methods for fabricating a device formation region, that is, one is a selective (preferential) oxidation method and the other is a trench separation method.

According to the selective oxidation method, the device formation region is formed by photoetching using a reticle as an etching mask. A conventional reticle is composed of a light transmission layer and a light shield region formed to be a rectangle on the light transmission layer.

In fabrication of a conventional semiconductor device, a first resist pattern is formed on a silicon substrate by photoetching using the reticle as an etching mask. At this time, the first resist pattern is formed to be along a 27% uniform intensity line of light passing through the light transmission layer. Thus, the first resist pattern has two curved portions each having the same radius.

Next, a field oxide layer is formed on the silicon substrate as an insulation layer for a device separation region, and a device formation region is formed by etching using the first resist pattern as an etching mask. At this time, the device formation region is shaped to be like a concave mirror being encircled with an inner edge of the field oxide layer.

Next, a polysilicon layer is formed on the whole process surface of the substrate, and a resist layer is formed on a surface of the polysilicon. After that, the resist layer is etched, so that a second resist pattern for gate electrodes is formed thereon.

Finally, the polysilicon layer is etched with using the second resist pattern as an etching mask, so that the gate electrodes are formed on the device formation region.

According to the conventional semiconductor device, however, there is a disadvantage in that, when the device formation region is formed, radiation light is converged to an inside of the device formation region by light reflection on the inner edge of the field oxide layer, because the device formation region is shaped to be like a concave mirror. Then, the reflected light is radiated to a side surface of the second resist pattern, so that the side surface which is an inaccurate portion is also etched. Therefore, depressions are formed at the second resist pattern, so that the gate electrodes are provided with depressions corresponding to the depressions of the second resist pattern. As a result, a reliability of the semiconductor device is lowered.

SUMMARY OF THE INVENTION

Accordingly, it is an object of the invention to provide a semiconductor device in which a pattern having a precise shape can be formed on a device formation region.

It is a further object of the invention to provide a reticle for fabricating a device formation region by which a pattern having a precise shape can be formed.

According to a first feature of the invention, semiconductor device, including:
  a semiconductor substrate;
  an insulation layer formed on the semiconductor substrate for separating a device formation region from another region; and
  a device pattern formed on the device formation region by photoetching;
  wherein the device formation region is shaped to have at least two curved portions having different radiuses so that photolithography light is not converged to a point of an inside of the device formation region by light reflection on an inner edge of the insulation layer, when the device pattern is formed.

According to a second feature of the invention, a reticle used for fabricating a semiconductor device, including:
  a light transmission area through which light is transmitted; and
  a light shield region formed at a part of the light transmission area, which is used as an etching mask when a device formation region is formed on a semiconductor substrate by photoetching;
  wherein the light shield region is shaped to be a predetermined shape so that a uniform intensity line of light passing through the light transmission area has at least two curved portions having different radiuses.

BRIEF DESCRIPTION OF THE DRAWINGS

The invention will be explained in more detail in conjunction with appended drawings; wherein.

DESCRIPTION OF THE PREFERRED EMBODIMENTS

Before describing a semiconductor device according to the invention, the aforementioned conventional semiconductor device will be explained in conjunction with FIGS. 1A to 1F, 2 and 3.

Figure 1A:
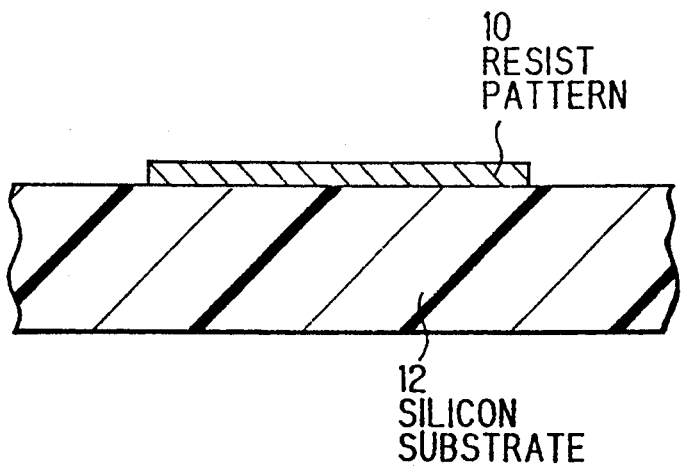
FIGS. 1A to 1F are cross-sectional views showing a fabricating process of a conventional semiconductor device.

The conventional semiconductor device is fabricated by the following process shown in FIGS. 1A to 1F. First, a resist pattern 10 is formed on a silicon substrate 12 as shown in FIG. 1A by photoetching with using a reticle 14 as an etching mask. The reticle 14 which is shown in FIG. 2 is provided with a light shield region 16 of chrome which is shaped to be rectangle on a light transmission area 18. The resist pattern 10 is shaped along a 27% uniform intensity line 20 of light passing through the light transmission area 18, and has two curved portions each having a radius "R" at both sides. The 27% uniform intensity line 20 becomes a border line of the patterning in a high resolution positive photoresist.

Figure 1B:
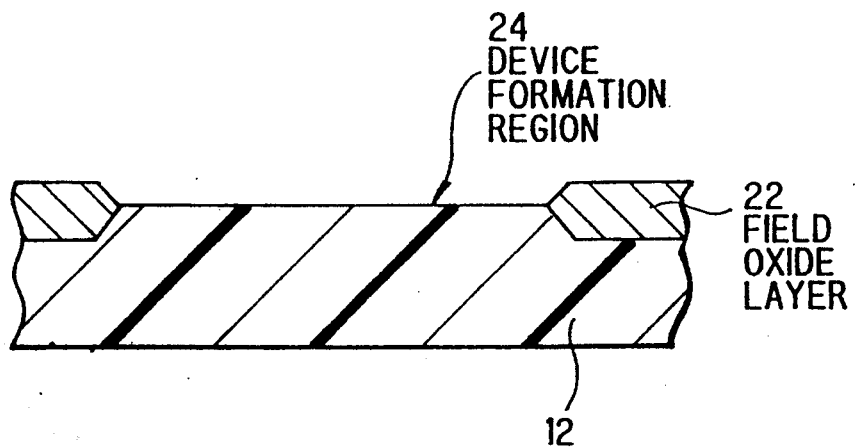
Figure 1C:
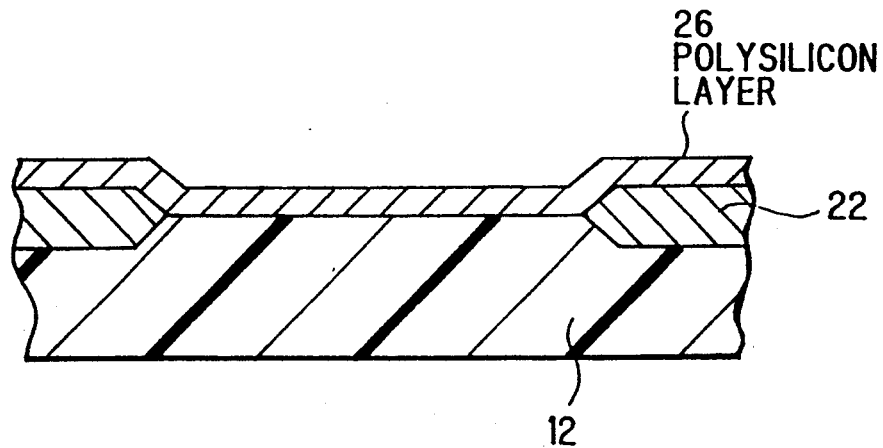
Figure 1D:
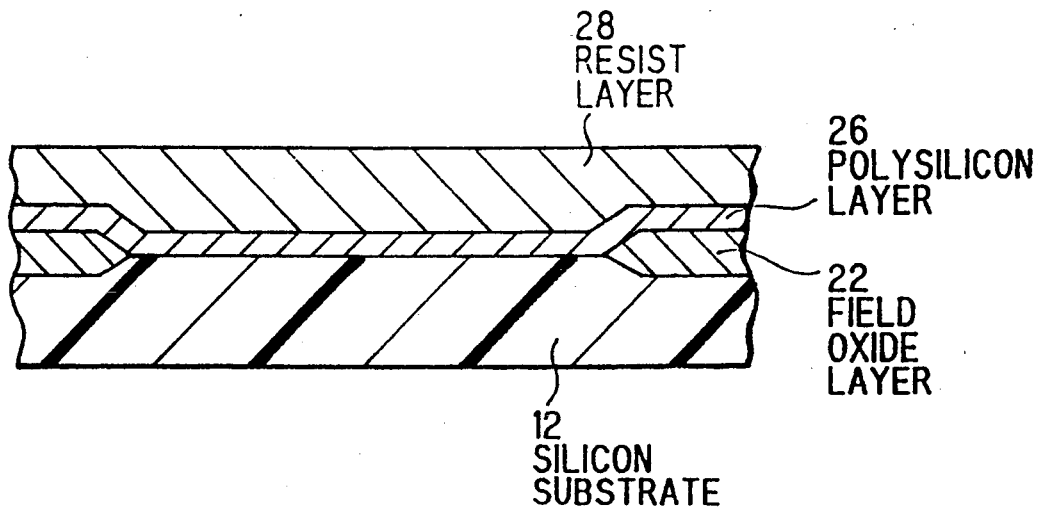
Figure 2:
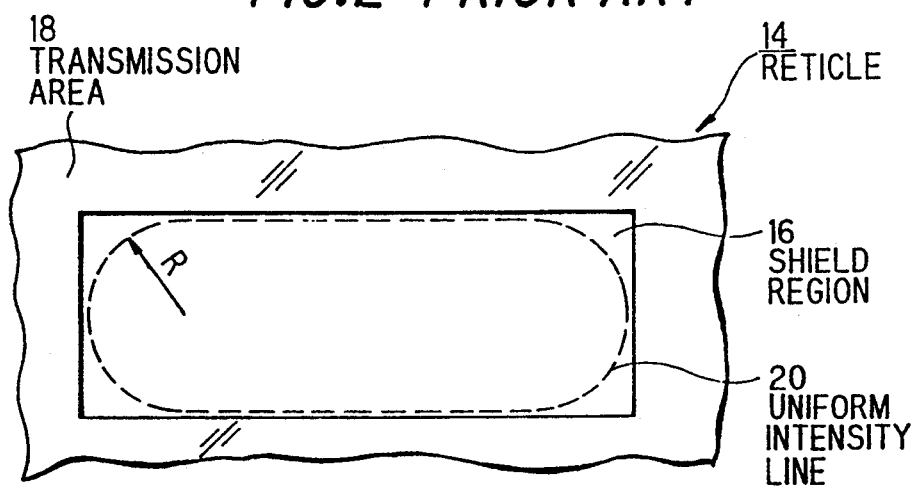
FIG. 2 is a plane view showing a conventional reticle used for fabricating the conventional semiconductor device.

Next, a field oxide layer 22 is formed on the silicon substrate 12, and a device formation region 24 is formed thereon by a selective (preferential) oxidation method with using the resist pattern 10 as a mask as shown in FIG. 1B. At this time, the device formation region 24 is shaped to be like a concave mirror being encircled with an inner edge of the field oxide layer 22. Then, a polysilicon layer 26 is formed on the whole process surface of the substrate as shown in FIG. 1C, and a resist layer 28 is formed on a surface of the polysilicon layer 26 as shown in FIG. 1D.

Figure 1E:
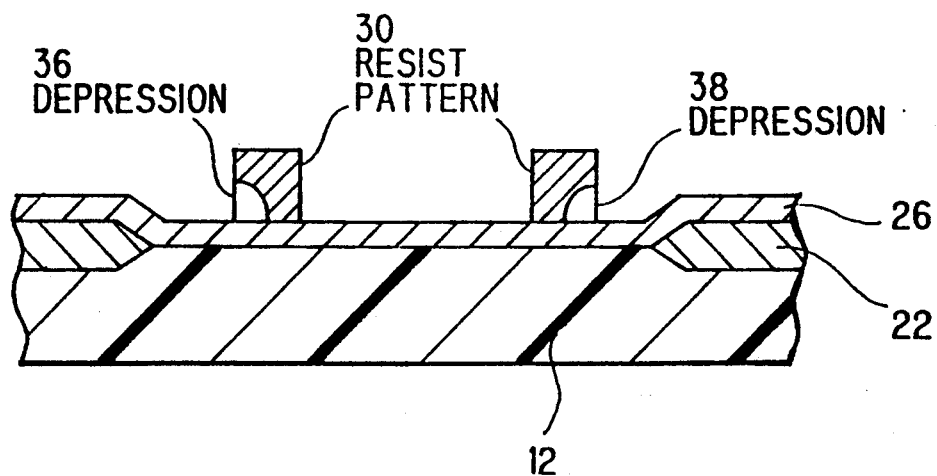

After that, a resist pattern 30 for gate electrodes 32 and 34 is formed by photoetching as shown in FIG. 1E. In this process, radiation light is converged to an inside of the device formation region 24 by light reflection on the inner edge of the field oxide layer 22, so that the reflected light is radiated to a side surface of the resist pattern 30. Therefore, the resist pattern 30 is etched at the side surface, so that depressions 36 and 38 are formed thereat.

Figure 1F:
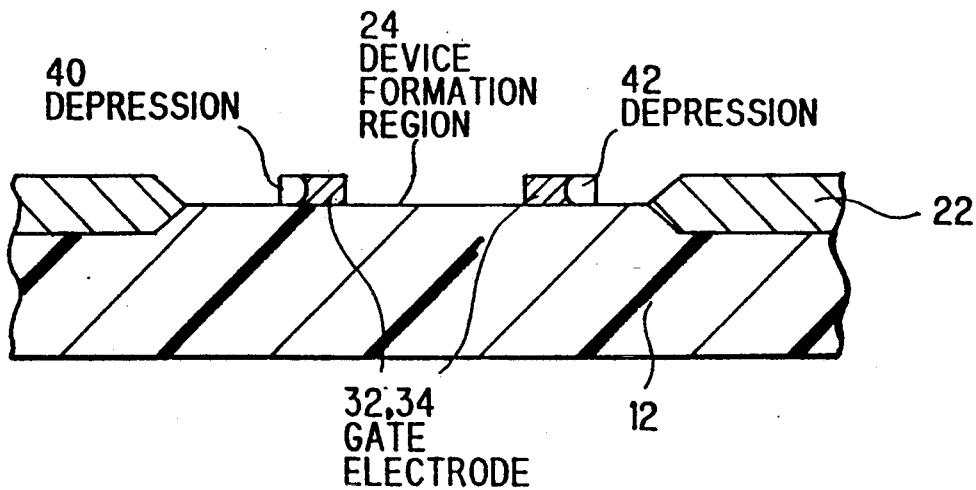
Figure 3:
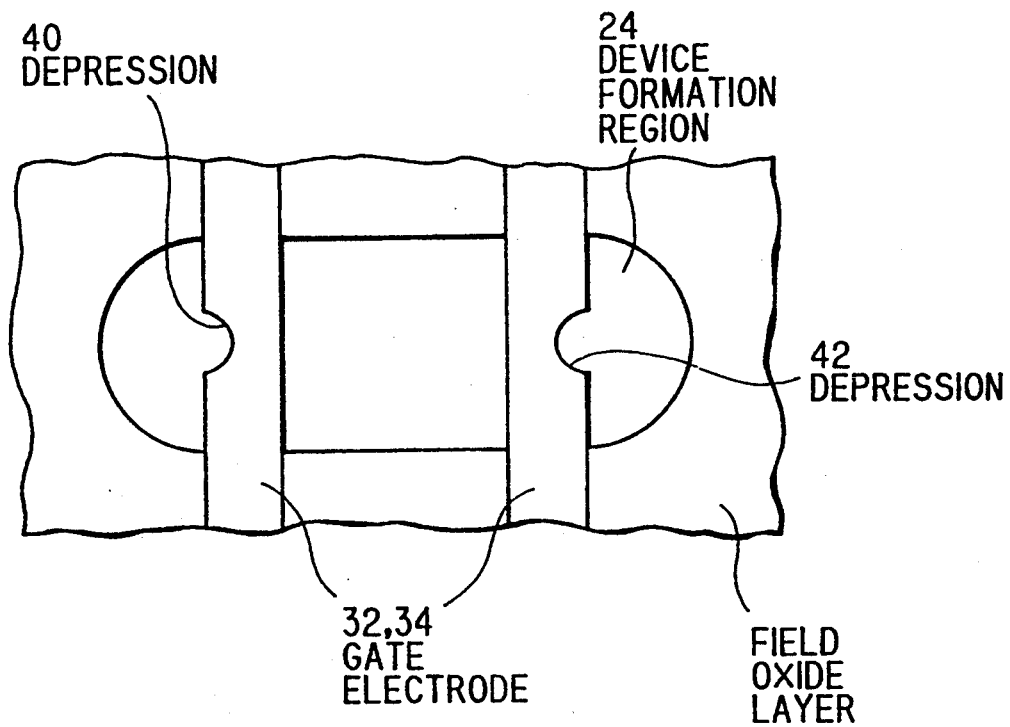
FIG. 3 is a plane view showing the conventional semiconductor device.

Finally, the polysilicon layer 26 is etched with using the resist pattern 30 as an etching mask, so that the gate electrodes 32 and 34 are formed on the device formation region 24 as shown in FIG. 1F. In this process, the gate electrodes 32 and 34 are provided with depressions 40 and 42 as shown in FIGS. 1F and 3.

According to the conventional semiconductor device, however, there is a disadvantage in that a reliability thereof is lowered, because the gate electrodes 32 and 34 are provided with the depressions 40 and 42.

Next, a semiconductor device of a first preferred embodiment will be explained in conjunction with FIGS. 4A, 4B, 5 and 6.

Figure 5:
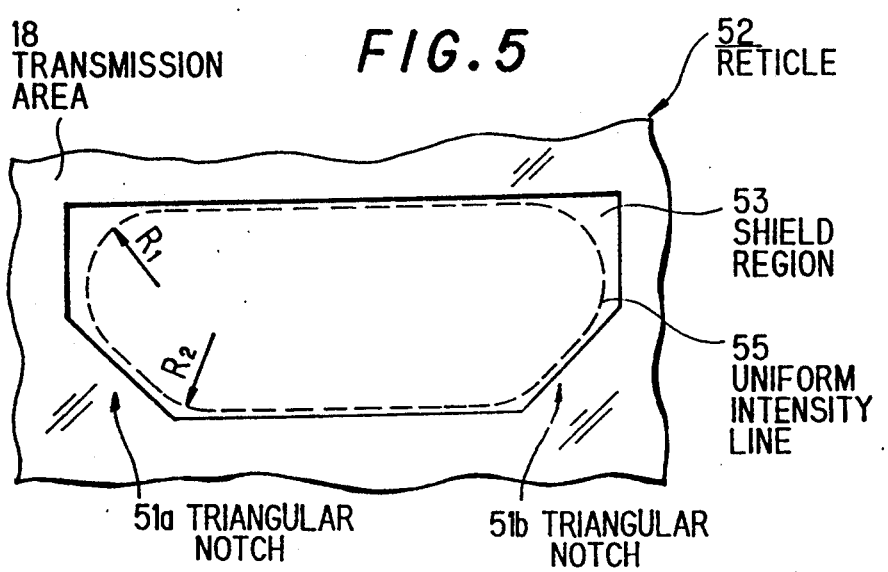
FIG. 5 is a plane view showing a reticle used for the first preferred embodiment.

In the first preferred embodiment, a reticle 52, as shown in FIG. 5, which is provided with a light shield region 53 of chrome in a part of a light transmission area 18 is used. The light shield region 53 is shaped to have two triangular notches 51a and 51b so that a uniform intensity line 55 has two curved portions having different radiuses "$R_1$" and "$R_2$".

Figure 6:
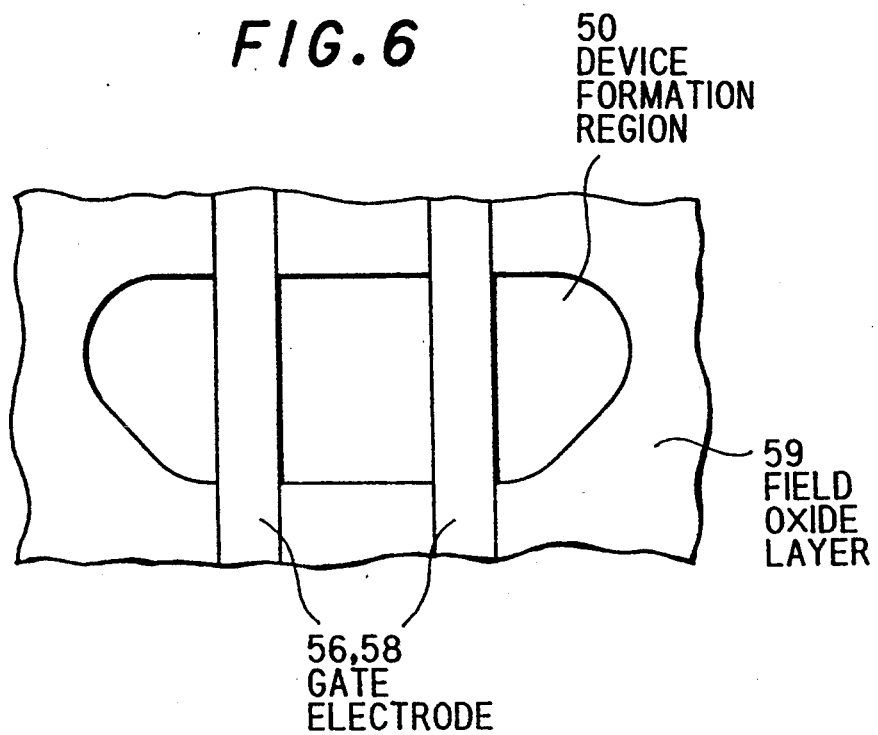
FIG. 6 is a plane view showing the semiconductor device of the first preferred embodiment.
Figure 4A:
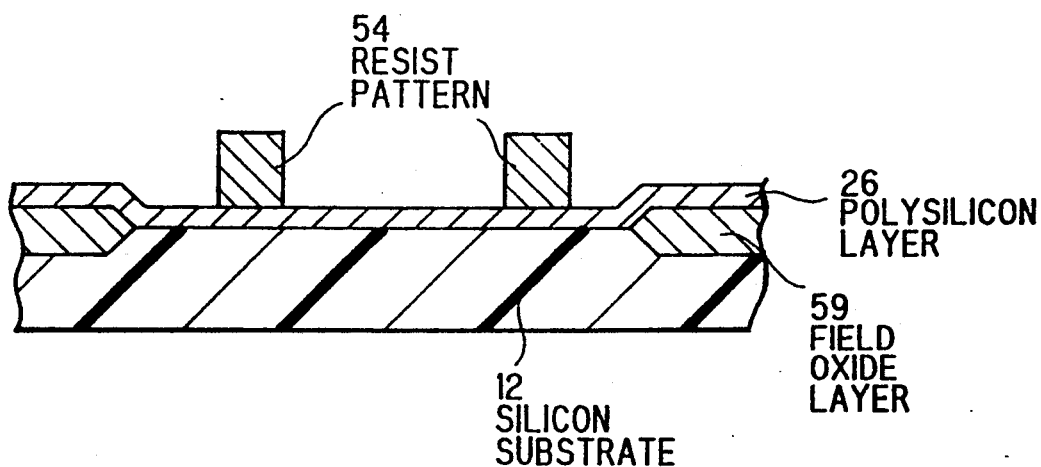
FIGS. 4A and 4B are cross-sectional views showing a fabricating process of a semiconductor device of a first preferred embodiment according to the invention.
Figure 4B:
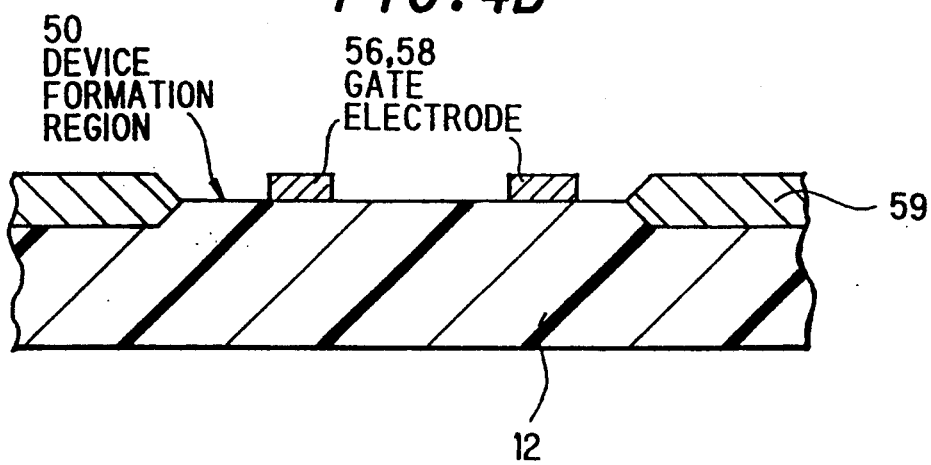

According to the first preferred embodiment, a resist pattern 54 for gate electrodes 56 and 58 are formed to have no depression as shown in FIG. 4A and 6, because a device formation region 50 which is encircled with a field oxide layer 59 is shaped to have two curved portions having different radiuses corresponding to the reticle 52. Therefore, the gate electrodes 56 and 58 are shaped to have no depression as shown in FIG. 4B and FIG. 6.

Figure 7:
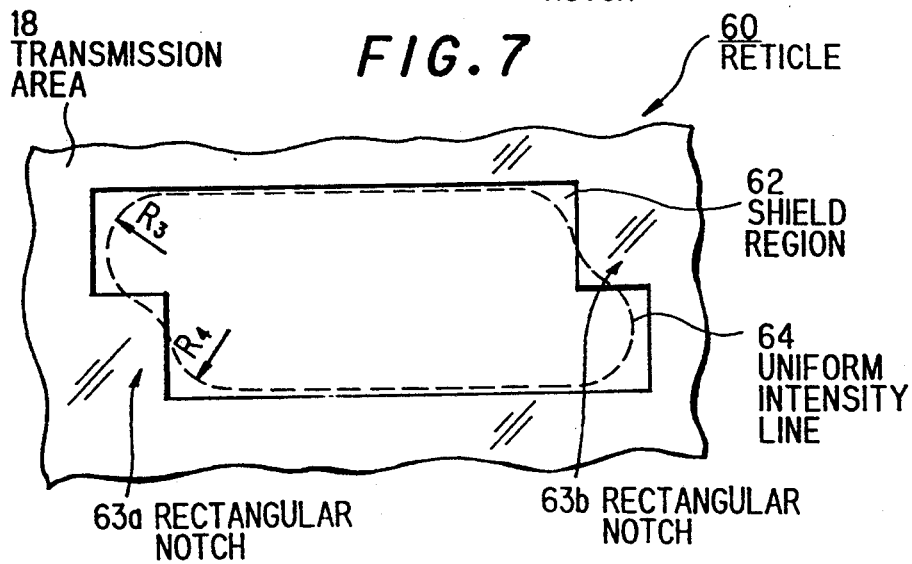
FIG. 7 is a plane view showing a reticle used for a second preferred embodiment according to the invention.

FIG. 7 shows a reticle 60 of a second preferred embodiment according to the invention. The reticle 60 is provided with a light shield region 62 of chrome in a part of a light transmission area 18. The light shield region 62 is shaped to have two rectangular notches 63a and 63b so that a uniform intensity line 64 has two curved portions having different radiuses "$R_3$" and "$R_4$" as shown in the figure. According to the second preferred embodiment, the same advantage as in the first preferred embodiment can be obtained.

According to the first and second preferred embodiments, the reticles 52 and 62 are provided with the two notches 51a and 52a, and 63a and 63b, however, the reticle may be provided with more than three notches.

Although the invention has been described with respect to specific embodiment for complete and a reticle used for clear disclosure, the appended claims are not to be thus limited but are to be construed as embodying all modification and a reticle used for alternative constructions that may occur to one skilled in the art which fairly fall within the basic teaching herein set forth.

What is claimed is:

1. A semiconductor device, comprising:
   a semiconductor substrate;
   a device formation region having a flat top surface;
   an insulation layer on said semiconductor substrate for separating said device formation region from another region; and
   a device pattern on said top surface of said device formation region,
   said top surface of said device formation region being lower than a top surface of said insulation layer, said device formation region being shaped to have at least two curved portions having different radiuses so that photolithography light is not converged to a point where said device pattern is to be located, inside of said device formation region, by light reflection on an inner edge of said insulation layer.

* * * * *